United States Patent [19]
Cao et al.

[11] Patent Number: 5,525,914
[45] Date of Patent: Jun. 11, 1996

[54] CMOS DRIVER CIRCUIT

[75] Inventors: Tai Cao; Satyajit Dutta; Thai Q. Nguyen, all of Austin; Nandor G. Thoma, Plano; Thanh D. Trinh, Austin, all of Tex.

[73] Assignee: International Business Machines Corporation, Armonk, N.Y.

[21] Appl. No.: 376,704

[22] Filed: Jan. 23, 1995

[51] Int. Cl.⁶ .............................................. H03K 19/0185
[52] U.S. Cl. ................................. 326/71; 326/21; 326/73
[58] Field of Search .................................. 326/17, 21, 71, 326/73, 74, 83, 86, 93, 98

[56] References Cited

U.S. PATENT DOCUMENTS

| | | |
|---|---|---|
| 4,479,216 | 10/1984 | Krambeck et al. . |
| 4,490,821 | 12/1984 | Lacher . |
| 4,656,372 | 4/1987 | Sani et al. .................................. 326/73 |
| 4,689,505 | 8/1987 | Ghoshal . |
| 5,008,636 | 4/1991 | Markinson et al. . |
| 5,019,728 | 5/1991 | Sanwo et al. . |
| 5,023,488 | 6/1991 | Gunning ................................. 326/86 X |
| 5,089,723 | 2/1992 | Davis et al. .............................. 326/73 |
| 5,115,455 | 5/1992 | Samaras et al. . |
| 5,172,016 | 12/1992 | Dobberpuhl . |
| 5,191,581 | 3/1993 | Woodbury et al. . |
| 5,243,623 | 9/1993 | Murdock . |
| 5,311,081 | 5/1994 | Donaldson et al. . |
| 5,317,202 | 5/1994 | Waizman . |
| 5,327,465 | 7/1994 | Winen et al. . |

Primary Examiner—David R. Hudspeth
Attorney, Agent, or Firm—Kelly K. Kordzik; Winstead Sechrest & Minick; Mark E. McBurney

[57] ABSTRACT

A clock distribution system for a data processing system is implemented in CMOS technology wherein a full-swing differential clock signal is converted to a low-voltage swing differential clock signal by a driver's circuit and then returned to a full-swing differential clock signal at each receiver circuit.

25 Claims, 8 Drawing Sheets

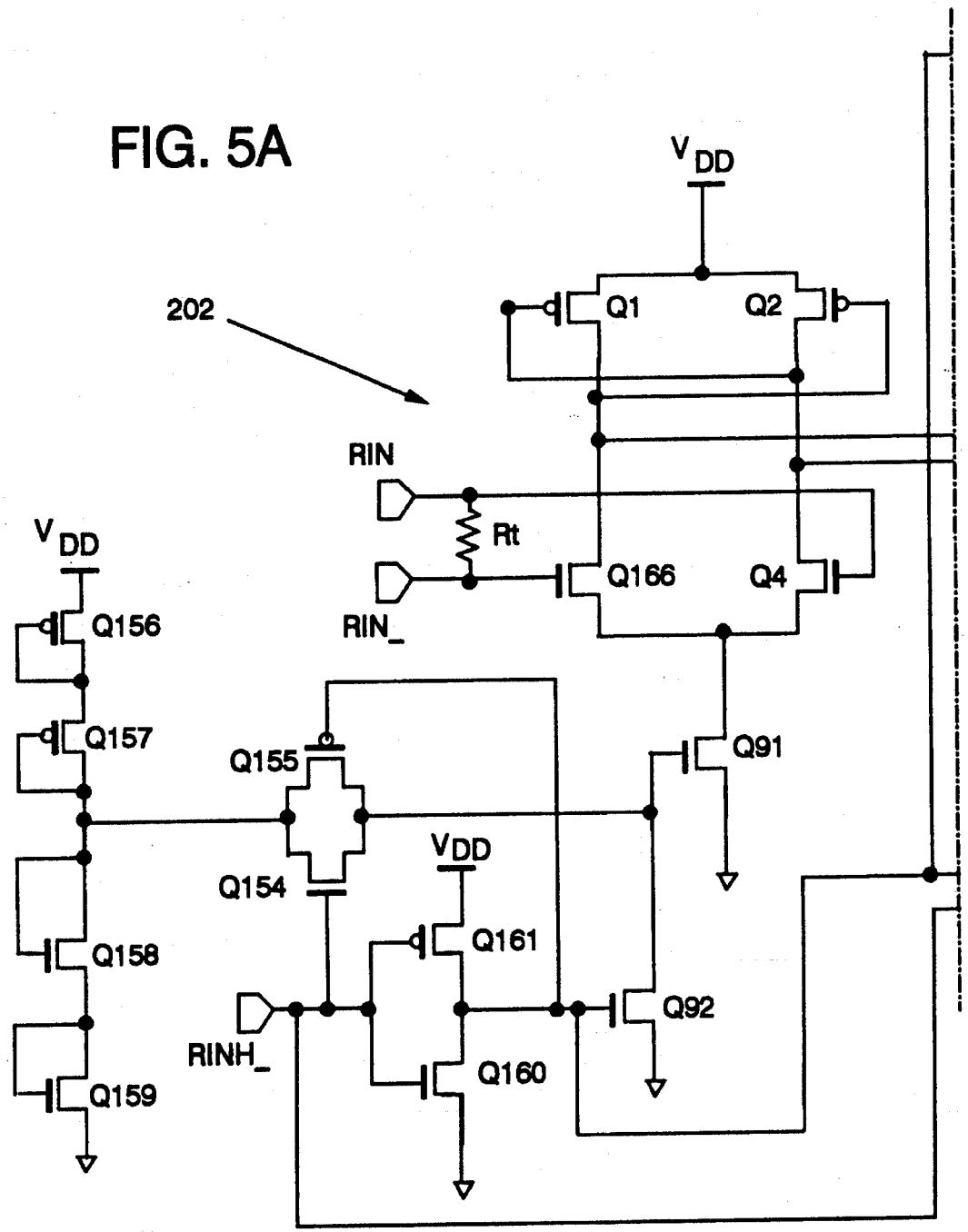

CMOS DRIVER CIRCUIT

CROSS REFERENCE TO RELATED APPLICATIONS

This application for patent is related to the following application for patent filed concurrently herewith:

CMOS DIFFERENTIAL RECEIVER, Ser. No. 08/376,705.

The above cross-referenced application is hereby incorporated by reference into this Application as though fully set forth herein.

FIELD OF THE INVENTION

The present invention relates in general to data processing systems, and in particular, to driver and receiver circuits for distribution of a clock signal.

BACKGROUND OF THE INVENTION

A clock signal is a steady stream of timing pulses that synchronize each and every operation within a data processing system. The clock rate of a computer essentially determines the maximum operating speed of that computer. Computer designers are continually attempting to increase the speed of computers, and thus always desire a faster clock rate.

A problem with merely increasing the clock rate is that the signal generated and transmitted becomes degraded at high frequencies to the extent where the various components within the data processing system are either not able to interpret the clock pulses or erroneously interpret clock signals, resulting in a lack of synchronization within the data processing system. One of these problems is a skewing of the clock signal, which may result in the clocked circuits not responding evenly to the clock signal. A related symptom is the concept of duty cycle. If each pulse of the clock signal is not comprised of substantially a 50% duty cycle, synchronization may be lost.

Complimentary Metal-Oxide Semiconductor ("CMOS") field-effect transistor logic circuitry has become a dominant technology in the production and manufacture of circuitry in data processing systems. Such CMOS transistors offer low power dissipation, but require a minimum level of bias voltage in order to effectively operate. In comparison to bipolar technology, CMOS operates on a square law principal. Bipolar components consume more power than CMOS components. Furthermore, CMOS is voltage dependent while bipolar components are dependent upon current to drive the circuit. CMOS circuits operate on a threshold voltage, which is the voltage that turns a device on. This bias voltage commonly determines the voltage swing of a clock signal produced with such CMOS circuitry. However, this voltage swing limits the clock speed in that the rise time required to transition from the low level to the high voltage level of the clock signal determines how quickly the clock signal can transition from one pulse to the next. In other words, it takes a longer time for the signal to rise and then to fall. A full swing voltage signal also dissipates more power than a low voltage swing signal. Additionally, a full swing signal causes more coupled noise, since noise is proportional to the voltage swing. Furthermore, a full voltage swing signal can cause distortion of the clock pulse width induced by dispersion in the distribution media.

As a result of the foregoing, there is a need in the art for clock generation circuitry that provides a higher frequency clock signal at lower voltage levels within CMOS technology.

SUMMARY OF THE INVENTION

Thus, it is an objective of the present invention to implement a clock distribution system for a data processing system in CMOS technology that is capable of transferring a high frequency, low voltage swing clock signal to various portions of a data processing system without skewing and general degradation of the clock signal.

In an attainment of the above objective, a CMOS differential driver circuit is implemented to receive a full swing voltage clock signal and convert this signal to a low voltage clock signal for transmission to various receivers throughout the data processing system, which is then reconverted by a CMOS differential receiver circuit to a full swing clock signal for use by the various portions of the data processing system. Frequencies of 200 and 400 MHz are achievable with the circuitry of the present invention.

The driver and receiver circuits are also implemented with circuits that place the driver and/or receiver in a test mode.

The driver and receiver circuits of the present invention may be implemented within a uniprocessor or multiprocessor data processing system having one or more processors coupled via a system bus to a system memory and other peripheral devices.

An advantage of the present invention is that it provides a high stability, low jitter differential clock signal to various logic circuits within a data processing system, with a duty cycle at substantially 50%.

Another advantage of the present invention is that it minimizes clock skew.

Yet another advantage of the present invention is that it transmits a low voltage swing differential clock signal to provide for higher speed transmissions.

Still yet another advantage of the present invention is that it supplies differential clock signals creating a cancellation of electromagnetic fields and cross talk.

Additionally, an advantage of the present invention is that the circuits provide orthogonal output states when inputs to the circuits are floating.

Another advantage is that the receiver can operate over a common mode voltage range that will allow ±1.0 volt potential ground difference between the driver and receiver power supplies.

Another advantage is that the low voltage level alleviates clock pulse width distortion induced by dispersion in the distribution media.

And another advantage of the present invention is that delay tracking between the driver and receiver is matched, within a small percentage.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
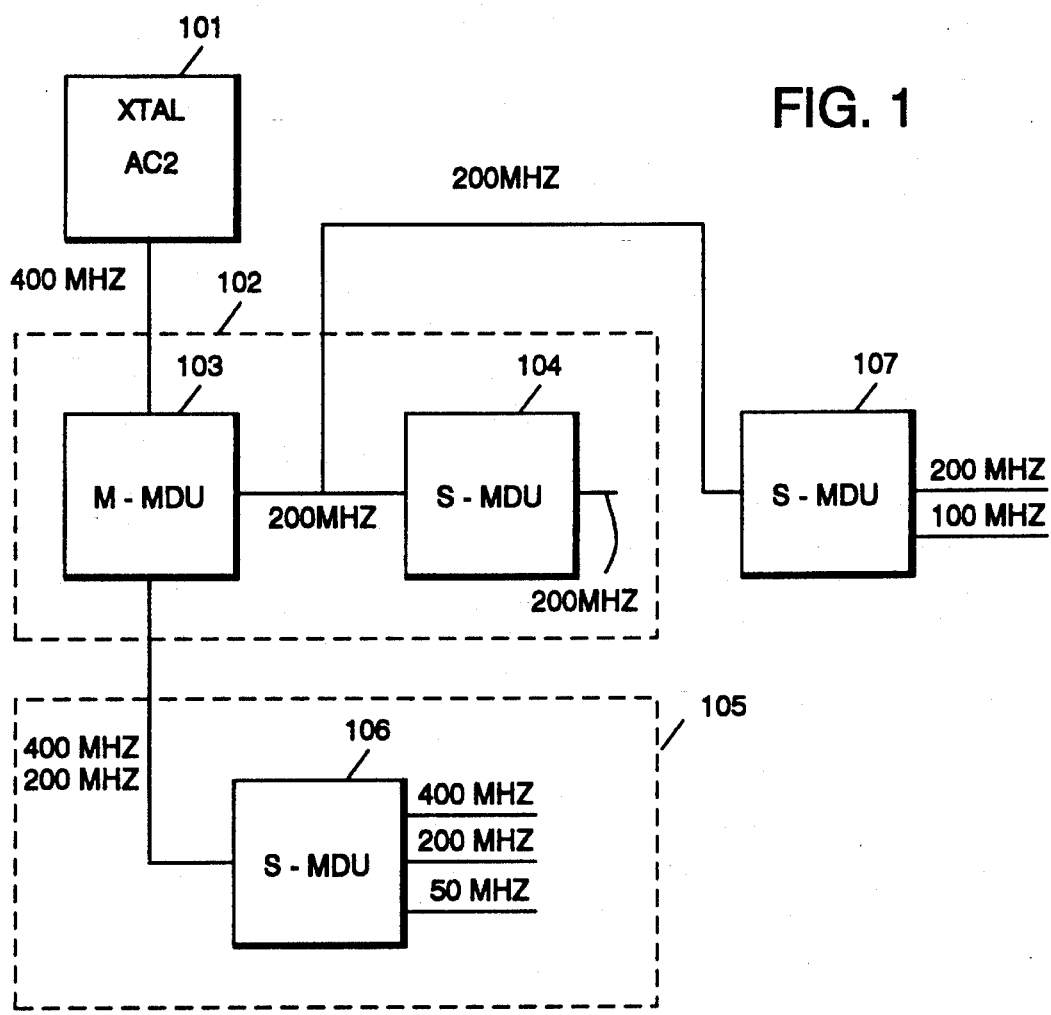
FIG. 1 illustrates clock distribution in a data processing system in accordance with the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated a clock distribution as may be implemented within a data processing system, such as the system illustrated in FIG. 6 described below. Crystal oscillator chip 101 produces the source frequency signal to be used as the clock signal throughout the system. Signals from chip 101 should adhere to the AC2 (advanced clock) specification. The AC2 specification provides that the voltage swing is between 500 millivolts and 1.3 volts, wherein a logic "0" is approximately 500 millivolts, while a logic "1" is approximately 1.3 volts; it further provides for a 50% crossing point at about 0.9 volts, and a 100 ohm termination at the inputs of the receiver circuit. Chip 101 supplies a 400 MHz signal to switch section 102, which contains master maintenance device unit ("M-MDU") 103 and slave maintenance device unit ("S-MDU") 104. A master maintenance device unit is a master clock chip, while a slave maintenance device unit is a slave clock chip, which receives clock signals from the master maintenance device unit. The master maintenance device unit can provide 400 MHz and 200 MHz clock signals to the slave maintenance device unit chips. The 400 MHz signal from crystal oscillator chip 101 is received by M-MDU 103, which in turn transmits clock signals to three different locations. A 200 MHz signal is transmitted from M-MDU 103 to S-MDU 104, which supplies a 200 MHz signal to switch section 107. 400 and 200 MHz signals are transmitted from M-MDU 103 to S-MDU 106, which resides within processor module 105. Processor module 105 consists of a CPU, an L2 cache and L2 directory and the clock chip (S-MDU). The L2 directory is primarily a static random access memory chip. S-MDU 106, in turn, supplies processor module 105 with 50, 200 and 400 MHz signals. M-MDU 103 also supplies a 200 MHz signal to S-MDU 107, which may reside on a memory card within the data processing system. S-MDU 107 is operable to supply 100 and 200 MHz signals to the memory card.

A clock receiver circuit in accordance with the present invention is located in M-MDU 103 to receive the 400 MHz signal from crystal oscillator chip 101. Receiver circuits are also located in S-MDU's 104, 106, 107 to receive the various signals from M-MDU 103. Furthermore, clock driver circuits are located within M-MDU 103 to transmit the various clock signals described above to S-MDU's 104, 106, 107.

Figure 2:
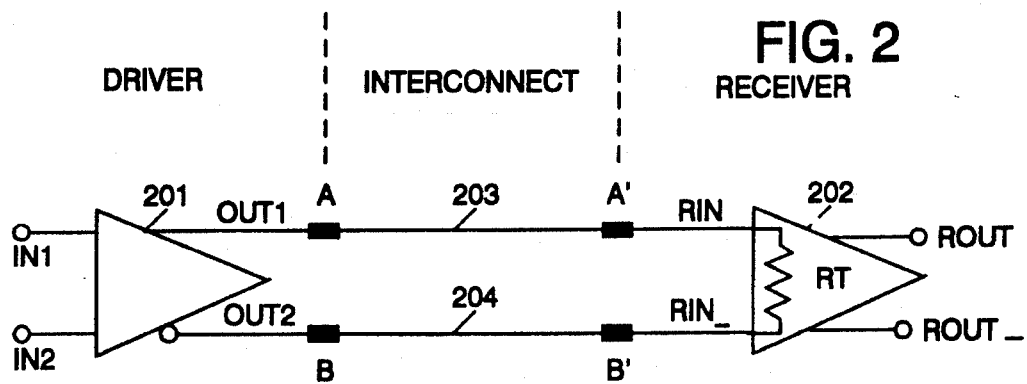
FIG. 2 illustrates an interconnection of the driver and receiver of the present invention.

Referring next to FIG. 2, there is illustrated a diagram of the interconnections between driver circuits and receiver circuits within the configuration illustrated in FIG. 1 in accordance with the present invention. Driver circuit 201 receives internally within M-MDU 103 the differential clock signals on inputs IN1 and IN2 and proceeds to drive these differential clock signals to receiver 202. Receiver 202 implements resistor Rt across inputs RIN and RIN_ in order to provide a matching impedance as a result of capacitances and inductance on transmission lines 203, 204 between driver circuit 201 and receiver circuit 202. Receiver circuit 202 then transforms the received differential clock signals to various frequency level signals (in a manner described below) for use by other circuits as described above with respect to FIG. 1. The present invention provides that driver circuit 201 will receive full swing differential clock signals on inputs IN1 and IN2 and transform them to low voltage differential signals for transmission on outputs OUT1 and OUT2 to each of receiver circuits 202, which then reconvert the received low voltage differential clock signals into full swing differential clock signals for use by other circuitry within the data processing system. Both driver circuit 201 and receiver circuit 202 are implemented within CMOS technology.

Figure 3:
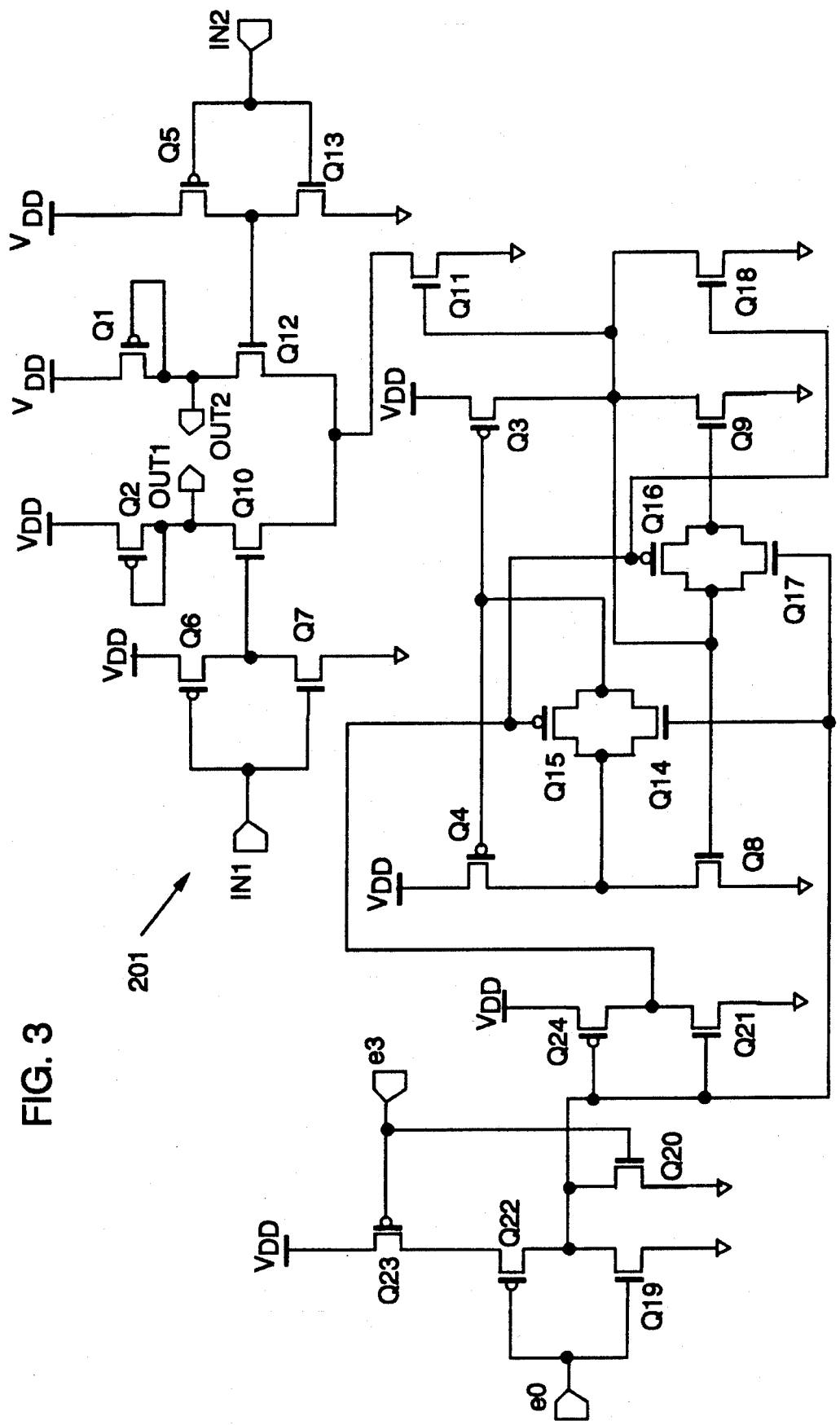
FIG. 3 illustrates a circuit diagram of the driver circuit of the present invention.

Referring next to FIG. 3, there is illustrated a detailed circuit diagram of driver circuit 201 in accordance with the present invention. Inputs IN1 and IN2 receive a differential clock signal at a full swing of preferably 0 to 2.5 volts. In a preferred embodiment, outputs OUT1 and OUT2 of circuit 201 provide a converted differential clock signal having a low voltage swing between 0.50 and 1.30 volts. This proper logic "1" level at differential outputs OUT1 and OUT2 is produced from output p-channel FETs Q2 and Q1 whose gate electrodes are tied to their respective drain electrodes. The logic "0" levels of differential outputs OUT1 and OUT2 are produced as a result of the potential across n-channel FET Q11, which acts as a constant current source maintaining a constant current flow from either leg of the outputs OUT1 and OUT2.

When IN1 is high, p-channel FET Q6 is off while n-channel FET Q7 is on, thus placing the gate electrode of n-channel FET Q10 to ground resulting in device Q10 being turned off. Thus, the level at output OUT1 is a high voltage level produced by voltage supply $V_{DD}$ and the voltage drop across p-channel FET Q2. As stated above, it is preferable that this output level be at approximately 1.3 volts.

When the voltage level of the inputted clock signal into input IN1 is at a low level, device Q6 is turned on, while device Q7 is turned off. Thus, device Q10 is turned on since the voltage $V_{DD}$ is supplied to the gate electrode of device Q10. As a result, the output level at output OUT1 is equal to the potential across device Q11, which is preferably 0.5 volts.

The output produced at output OUT2 is produced in a manner similar as the output for OUT1, except that this output is a differential clock output with respect to the aforementioned outputted clock signal on OUT1. The result is a differential output clock signal, which matches the inputted differential clock signal, but at a lower voltage swing.

The gate electrode of device Q11 is biased by the circuit network of devices Q3, Q4, Q8 and Q9.

It is desirable for circuitry within data processing systems to be testable. Within driver circuit 201, testability requirements are accomplished through NOR gate signals e0 and e3. The signal e0 is a function driver enable input defined by system functional requirements, while signal e3 is used for package level.

One of the test requirements is to be able to turn off constant current source device Q11 so that no current flows from the supply voltage $V_{DD}$ to ground except for leakage current. Devices Q14, Q15, Q16 and Q17 are used to control biasing in the network through the signals e0 and e3. These signals also control the n-channel FET Q18. In a normal operation, device Q18 is off and the gate of current source Q11 is controlled by the biasing network. Whenever either e0 or e3 goes to a logic "1", device Q18 is on, forcing the gate at Q11 to turn off. This mode also applies when both e0 and e3 go to logic "1". The following truth table is given for the testability signals for the clock application.

| e0 | e3 | OUT |
|---|---|---|
| 1 | 1 | Data Out |
| 0 | 1 | high impedance |
| 1 | 0 | high impedance |
| 0 | 0 | high impedance |

Figure 4:
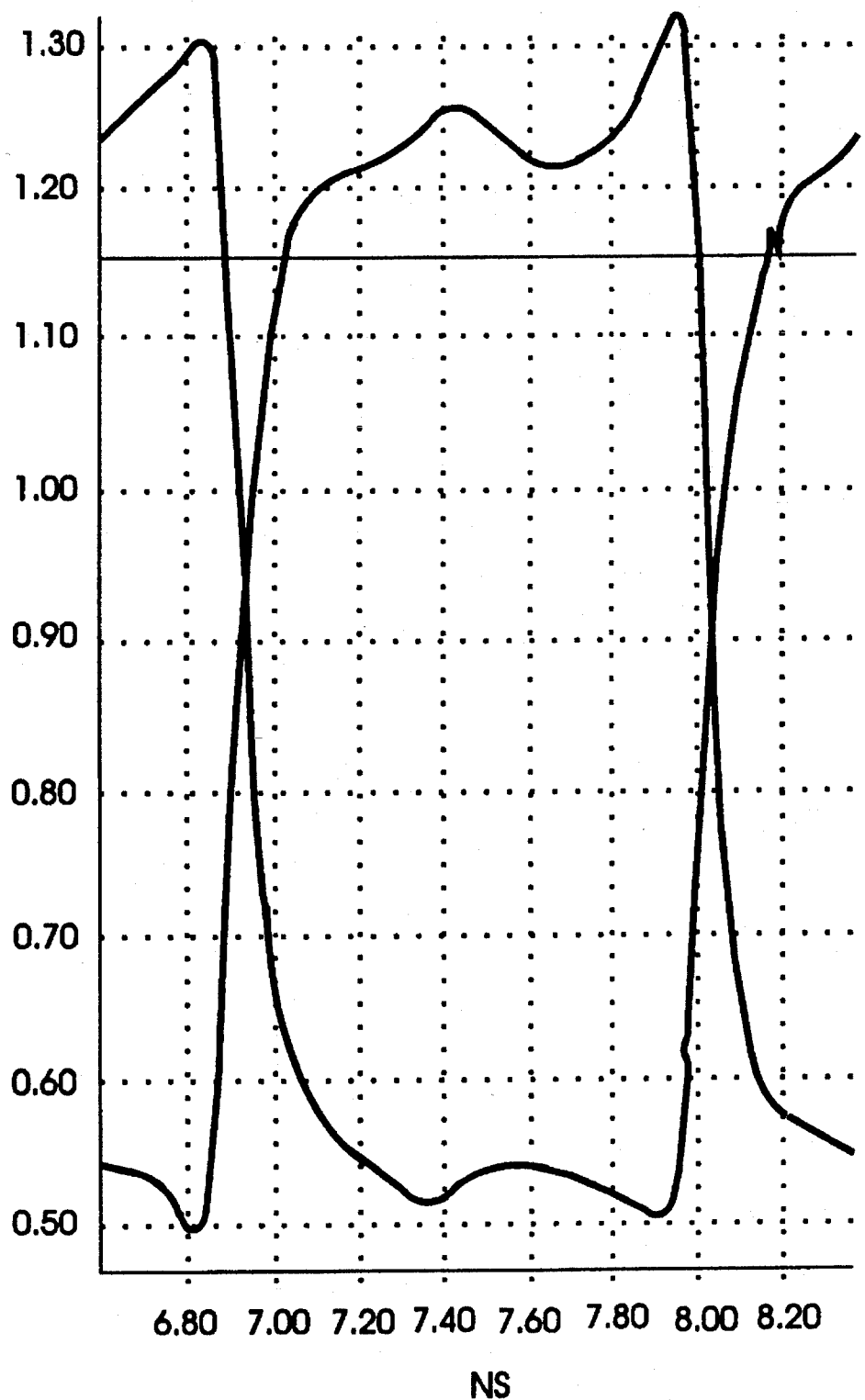
FIG. 4 illustrates an exemplary waveform diagram of the differential clock signals outputted from the driver circuit of the present invention.

Referring next to FIG. 4, there is illustrated an exemplary waveform diagram of the outputted differential clock signals from driver circuit 201 on outputs OUT1 and OUT2.

Figure 5B:
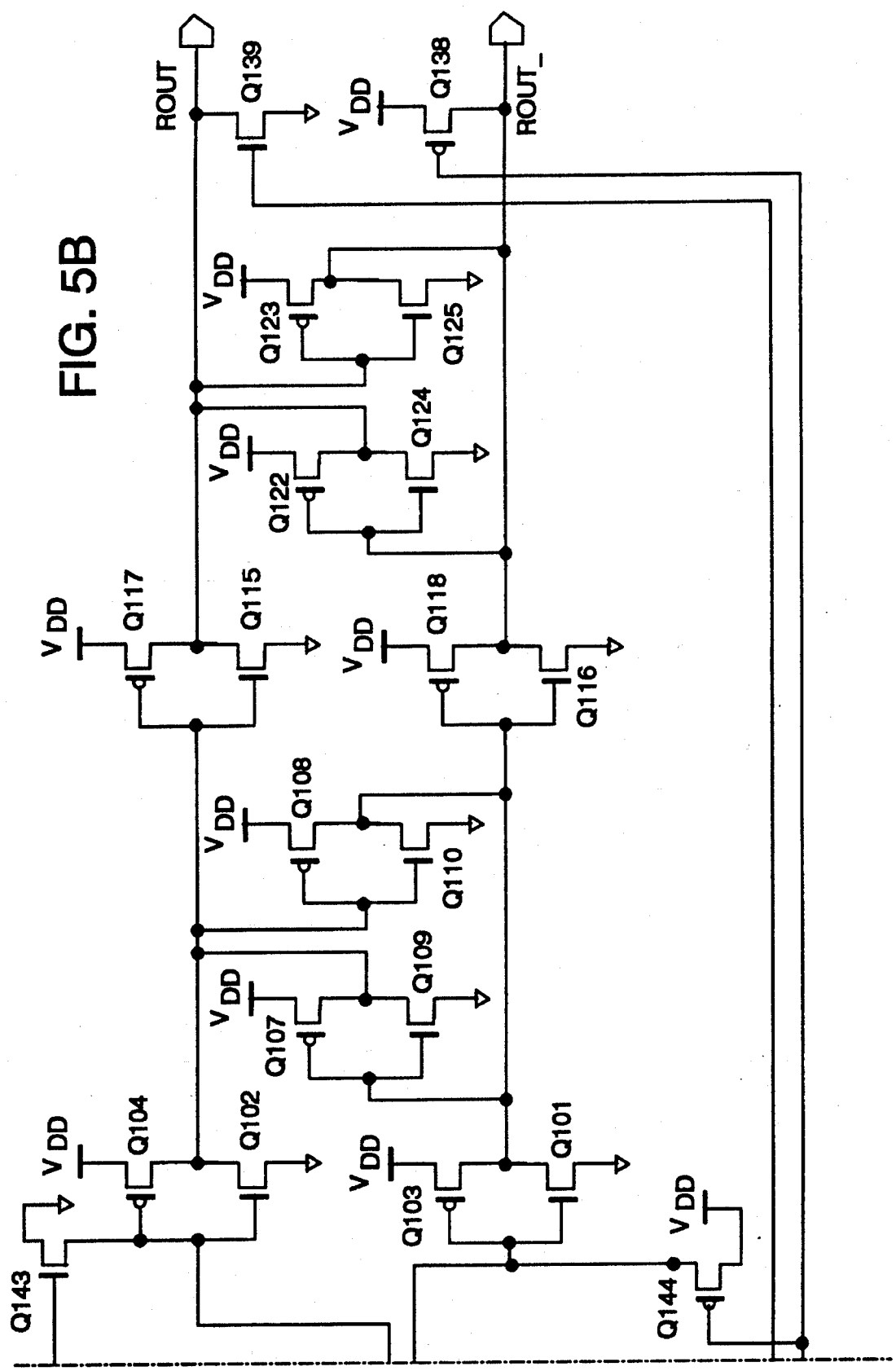
FIG. 5 illustrates a circuit diagram of the receiver circuit of the present invention.
Figure 8:
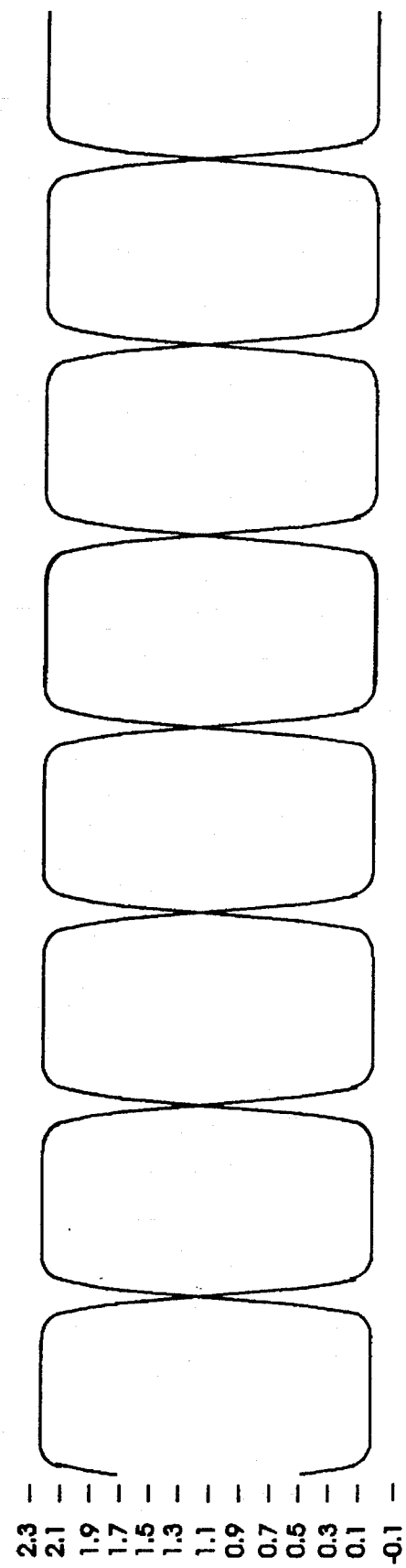
FIG. 8 illustrates an exemplary waveform diagram of the differential clock signals outputted from the receiver circuit of the present invention.

Referring next to FIG. 5, there is illustrated a circuit diagram for a preferred embodiment of receiver circuit 202. Receiver circuit 202 is designed to convert received low voltage differential signals from driver circuit 201 into accurate rail-to-rail signals having a full voltage swing, and to carry out the 400 MHz clock application with some testability requirements. The resulting rail-to-rail signals outputted on terminals ROUT and ROUT_ also exhibit a 50% crossing point to provide a 50% duty cycle. FIG. 8 illustrates an exemplary waveform diagram of a 400 MHz signal outputted on terminals ROUT and ROUT_.

In addition, circuit 202 provides essentially zero power consumption when receiver circuit 202 is disabled by inputting a low signal to input RINH_, which is described below. Furthermore, receiver circuit 202 provides testability functions to provide output orthogonal states when its inputs are floating.

As noted above, receiver circuit 202 is located in M-MDU 103 to receive the clock signal from crystal chip 101 and within S-MDU's 104, 106, 107 to receive the differential clock signals from M-MDU 103.

In the input section of circuit 202, the gate electrodes of p-channel FETS Q1 and Q2 are cross connected, such that the gate electrode of device Q1 is connected to the drain electrode of device Q2, while the gate electrode of device Q2 is connected to the drain electrode of device Q1 to provide the proper logic "1" signal of the differential outputs and to cause the outputs to have orthogonal states when the receiver inputs at terminals RIN and RIN_ are floating. The series n-channel devices Q4/Q166 and Q91 determine the "0" output level and the falling transitions of the output signals. Devices Q156, Q157, Q158 and Q159 function as a diode to supply a constant voltage (preferably 1.35 volts) to turn on device Q91. Devices Q107, Q108, Q109, Q110, Q122, Q123, Q124, and Q125 are used to regulate the output signals at terminals ROUT and ROUT_ such that these signals will cross each other at the 50% crossing point to meet one of the critical requirements of differential clock receiver design.

The device pairs of Q115, Q117 and Q116, Q118 act as inverters.

Inhibit signal RINH_ controls the output states of receiver circuit 202. When RINH_ is high, device Q92 is off, the pass gate consisting of devices Q154 and Q155 is on and receiver circuit 202 will operate normally. Thus, the output signals across terminals ROUT and ROUT_ will follow the input receiver signals at terminals RIN and RIN_. When RINH_ is low, the pass gate (Q154, Q155) is off, device Q92 is on and thus pulls device Q91 off, resulting in the constant DC current being cut off. Therefore, the power consumption of receiver circuit 202 will drop to 0. At the same time, devices Q138 and Q139 are on to pull ROUT_ and ROUT to high and low respectively to satisfy the testing requirement as shown in the following truth table:

| RINH_ | ROUT | ROUT_ |
|---|---|---|
| 1 | RIN | RIN_ |
| 0 | 0 | 1 |

Figure 6:
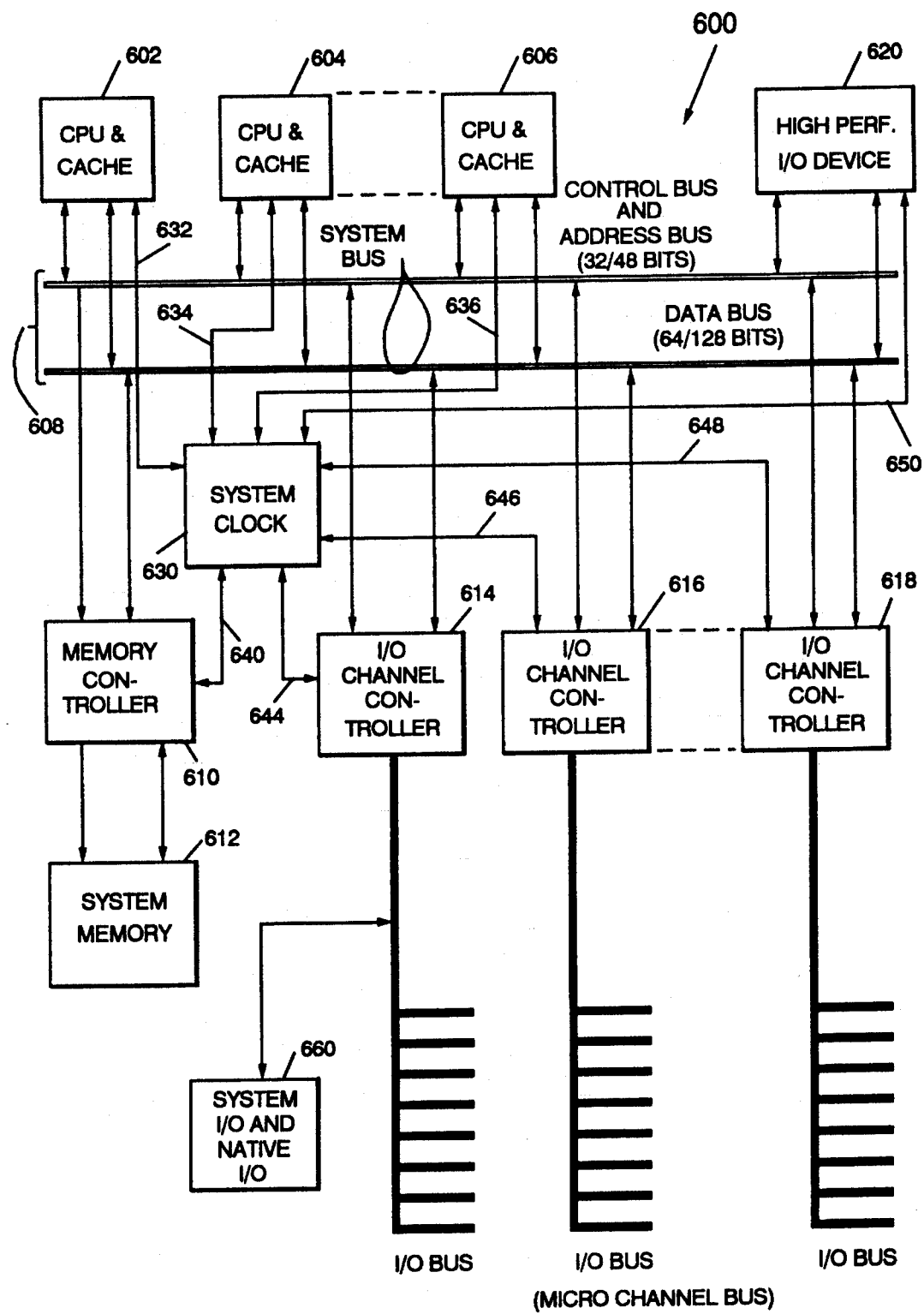
FIG. 6 illustrates a data processing system configurable for embodying the present invention.

Referring now to FIG. 6, a data processing system which advantageously embodies the present invention will be described. Multiprocessor system 600 includes a number of processing units 602, 604, 606 operatively connected to a system bus 608. Also connected to the system bus 608 is a memory controller 610, which controls access to system memory 612, and I/O channel controllers 614, 616, and 618. Additionally, a high performance I/O device 620 may be connected to the system bus 608. Each of the system elements described 602–620, inclusive, operate under the system clock 630 which sends a clock signal to each unit connected to the system bus 608 by point to point lines such as 632 to processor 602, 634 to processor 604, 636 to processor 606, 640 to memory controller 610, 644 to I/O channel controller 614, 646 to I/O channel controller 616, 648 to I/O channel controller 618, and 650 to high performance I/O device 620. Alternatively, a clock bus (not shown) may be utilized to transmit clock signals to each unit.

As an example, driver circuit 201 may be located within system clock 630, while receiver circuit 202 may be located within processor 604.

I/O channel controller 614 controls and is connected to system I/O subsystem and native I/O subsystem 660.

Each processor unit 602, 604, 606 may include a processor and a cache storage device.

Figure 7:
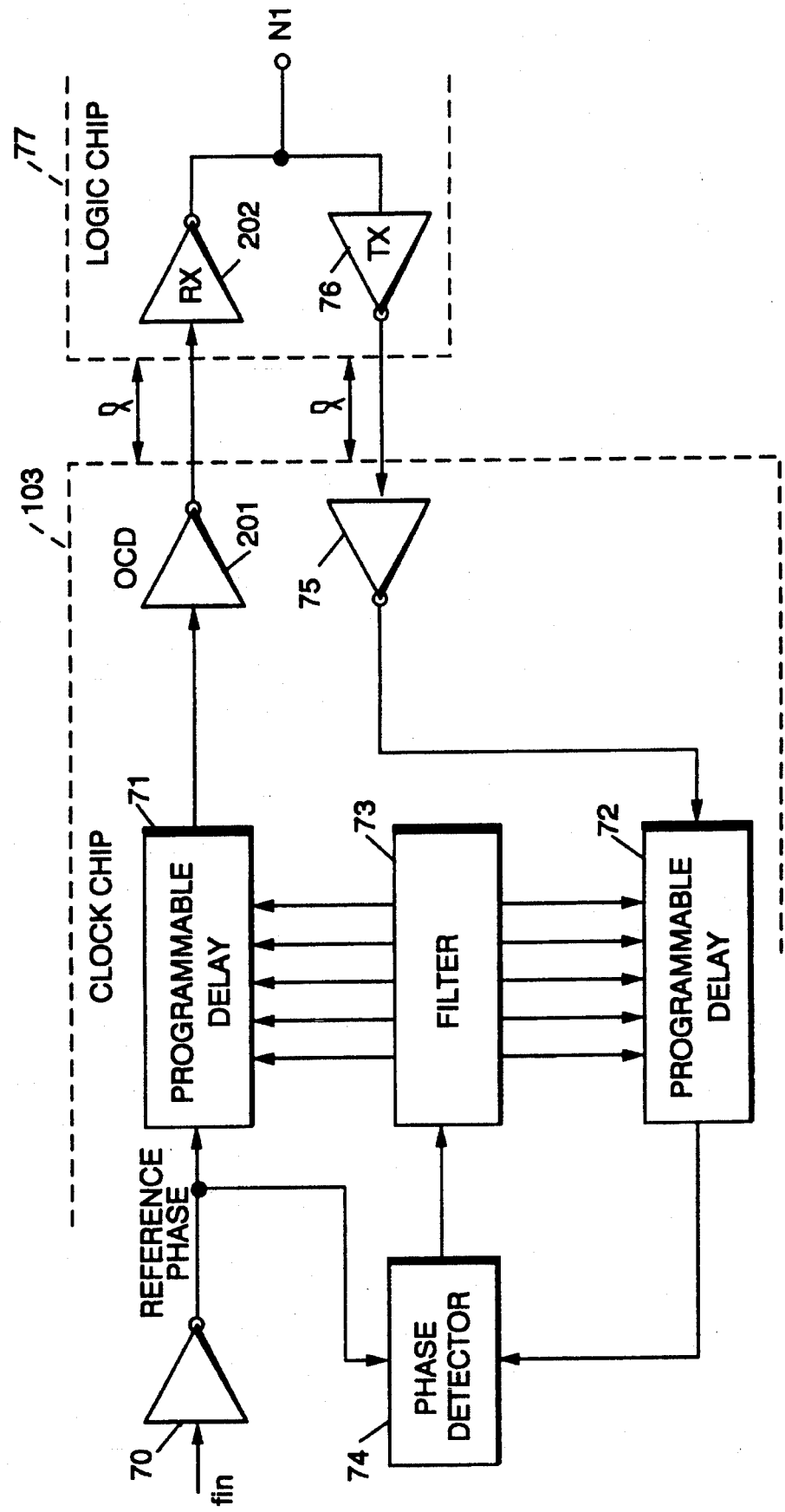
FIG. 7 illustrates a feedback clocking system for delay tracking.

Referring next to FIG. 7, there is illustrated a feedback clocking system implementing the driver and receiver circuits (201,202) of the present invention. Driver circuit 201 provides clock signals to logic chip 77, which includes receiver circuit 202 and transmitter 76. The clock signal is provided to circuits on logic chip 77 at node N1. Inverter 70 receives signal fin from the clock chip. Phase detector 74 compares the reference phase with a sense phase. Filter 73 and programmable delay circuits 71 and 72 utilize a signal from phase detector 74 to insure that the phase of the signal at node N1 is the same as the reference phase. This compensation is needed due to the potential differences in lengths l between chip 103 and logic chip 77. Thus, the delay difference between the forward path through driver circuit 201 to chip 77 and the return path from chip 77 through receiver circuit 75 must remain constant. The feedback system illustrated in FIG. 7 compensates for process delay variations.

With the foregoing hardware in mind, it is possible to explain the process-related features of the present invention. To more clearly describe these features of the present invention, discussion of other conventional features is omitted as being apparent to those skilled in the art. It is assumed that those skilled in the art are familiar with a multiuser, multiprocessor operating system, and in particular with the requirements of such an operating system for memory management including virtual memory, processor scheduling, synchronization facilities for both processes and processors, message passing, ordinary device drivers, terminal and network support, system initialization, interrupt management, system call facilities, and administrative facilities.

Although the present invention and its advantages have been described in detail, it should be understood that various changes, substitutions and alterations can be made herein without departing from the spirit and scope of the invention as defined by the appended claims.

What is claimed is:

1. A CMOS driver circuit, comprising:

means for receiving a signal having a voltage swing greater than two volts;

means for transforming said received signal having a voltage swing greater than two volts to a corresponding signal having a voltage swing of less than two volts; and means for outputting said corresponding signal having a voltage swing of less than two volts, wherein said received signal is a pair of differential signals, and said outputted corresponding signal is a pair of differential signals.

2. The CMOS driver circuit as recited in claim 1, wherein said corresponding signal has a voltage swing of less than or equal to one volt.

3. The CMOS driver circuit as recited in claim 1, wherein said transforming means further comprises:

means for switching said corresponding signal between first and second voltage references in relation to switching of said received signal.

4. The CMOS driver circuit as recited in claim 3, wherein said second voltage reference is supplied by a constant current source.

5. The CMOS driver circuit as recited in claim 4, wherein said constant current source is an n-type FET driven by a reference voltage coupled to a gate of said n-type FET.

6. The CMOS driver circuit as recited in claim 3, wherein said switching means further comprises:

a first p-type FET having a source electrode coupled to said first voltage reference and a gate electrode coupled to said receiving means;

a first n-type FET having a gate electrode coupled to said receiving means, a drain electrode coupled to a ground potential, and a source electrode coupled to a drain electrode of said first p-type FET;

a second n-type FET having a gate electrode coupled to said source electrode of said first n-type FET and drain electrode coupled to said second voltage reference, and a source electrode coupled to said outputting means; and a second p-type FET having a source electrode coupled to said first voltage reference, a gate electrode coupled to a drain electrode of said second p-type FET, and said drain electrode coupled to said outputting means.

7. The CMOS driver circuit as recited in claim 4, further comprising a means for placing said driver circuit in a testing mode by switching off said current source.

8. The CMOS driver circuit as recited in claim 1, wherein said corresponding signal having a voltage swing of less than two volts is a 200 or 400 MHz clock signal.

9. The CMOS driver circuit as recited in claim 2, wherein said outputted corresponding signal has a substantially 50% duty cycle.

10. A system for distributing a clock signal, said system comprising:

a CMOS driver circuit comprising means for receiving a signal having a voltage swing greater than two volts; means for transforming said received signal having a voltage swing greater than two volts to a corresponding signal having a voltage swing of less than two volts; and means for outputting said corresponding signal having a voltage swing of less than two volts; and a CMOS receiver circuit comprising means for receiving said corresponding signal having a voltage swing of less than two volts; means for converting said received corresponding signal having a voltage swing of less than two volts to a second corresponding signal having a voltage swing greater than two volts; and means for outputting said second corresponding signal having a voltage swing greater than two volts, wherein said converting means further comprises a means for switching said second corresponding signal between first and second voltage references in relation to switching of said received corresponding signal.

11. A system for distributing a clock signal, said system comprising:

a CMOS driver circuit comprising means for receiving a signal having a voltage swing greater than two volts; means for transforming said received signal having a voltage swing greater than two volts to a corresponding signal having a voltage swing of less than two volts; and means for outputting said corresponding signal having a voltage swing of less than two volts; and a CMOS receiver circuit comprising means for receiving said corresponding signal having a voltage swing of less than two volts; means for converting said received corresponding signal having a voltage swing of less than two volts to a second corresponding signal having a voltage swing greater than two volts; and means for outputting said second corresponding signal having a voltage swing greater than two volts, wherein said received signal having a voltage swing greater than two volts is a pair of differential signals, and said outputted corresponding signal is a pair of differential signals, and said second corresponding signal is a pair of differential signals.

12. The system as recited in claim 11, wherein said corresponding signal has a voltage swing of less than or equal to one volt, and wherein said received signal having a voltage swing greater than two volts is a pair of differential signals, and said outputted corresponding signal is a pair of differential signals, and said second corresponding signal is a pair of differential signals.

13. The system as recited in claim 12, wherein said transforming means further comprises:
   means for switching said corresponding signal between first and second voltage references in relation to switching of said received signal.

14. The system as recited in claim 13, wherein said switching means further comprises:
   a first p-type FET having a source electrode coupled to said first voltage reference and a gate electrode coupled to said receiving means;
   a first n-type FET having a gate electrode coupled to said receiving means, a drain electrode coupled to a ground potential, and a source electrode coupled to a drain electrode of said first p-type FET;
   a second n-type FET having a gate electrode coupled to said source electrode of said first n-type FET and drain electrode coupled to said second voltage reference, and a source electrode coupled to said outputting means; and
   a second p-type FET having a source electrode coupled to said first voltage reference, a gate electrode coupled to a drain electrode of said second p-type FET, and said drain electrode coupled to said outputting means.

15. The system as recited in claim 12, wherein said corresponding signal having a voltage swing of less than or equal to one volt is a 200 or 400 MHz clock signal having a substantially 50% duty cycle.

16. The system as recited in claim 11, wherein said means for receiving said corresponding signal having a voltage swing of less than two volts includes a resistive component across said means for receiving said corresponding signal.

17. The system as recited in claim 11, wherein said converting means further comprises:
   means for switching said second corresponding signal between first and second voltage references in relation to switching of said received corresponding signal.

18. The system as recited in claim 12, wherein said means for outputting said second corresponding signal having a voltage swing greater than two volts further comprises:
   means for regulating said pair of differential signals outputted from said CMOS receiver circuit with each other.

19. A data processing system comprising a processor, a memory device, a bus coupling said processor to said memory device, and a system for distributing a clock signal to portions of said processor and said memory device, said clock distributing system comprising:
   a CMOS driver circuit comprising means for receiving a pair of differential signals having a voltage swing greater than two volts, means for transforming said received pair of differential signals having a voltage swing greater than two volts to a corresponding pair of differential signals having a voltage swing of less than two volts; and means for outputting said corresponding pair of differential signals having a voltage swing of less than two volts; and
   a CMOS receiver circuit comprising means for receiving said corresponding pair of differential signals having a voltage swing of less than two volts; means for converting said received corresponding pair of differential signals having a voltage swing of less than two volts to a second corresponding pair of differential signals having a voltage swing greater than two volts; and means for outputting said second corresponding pair of differential signals having a voltage swing greater than two volts.

20. The data processing system as recited in claim 19, wherein said corresponding pair of differential signals having a voltage swing of less than two volts swing from approximately 0.5 volts to approximately 1.5 volts relative to ground.

21. A CMOS driver circuit, comprising:
   means for receiving a signal having a voltage swing greater than 1.3 volts;
   means for transforming said received signal having a voltage swing greater than 1.3 volts to a corresponding signal having a voltage swing of less than or equal to 1.3 volts; and
   means for outputting said corresponding signal having a voltage swing of less than or equal to 1.3 volts, wherein said received signal is a pair of differential signals, and said outputted corresponding signal is a pair of differential signals.

22. A CMOS driver circuit, comprising:
   means for receiving a signal having a voltage swing greater than two volts;
   means for transforming said received signal having a voltage swing greater than two volts to a corresponding signal having a voltage swing of less than two volts; and
   means for outputting said corresponding signal having a voltage swing of less than two volts,
   wherein said transforming means further comprises a means for switching said corresponding signal between first and second voltage references in relation to switching of said received signal.

23. A CMOS driver circuit, comprising:
   means for receiving a signal having a voltage swing greater than two volts;
   means for transforming said received signal having a voltage swing greater than two volts to a corresponding signal having a voltage swing of less than two volts; and
   means for outputting said corresponding signal having a voltage swing of less than two volts, wherein said corresponding signal having a voltage swing of less than two volts is a 200 or 400 MHz clock signal.

24. A system for distributing a clock signal, said system comprising:
   a CMOS driver circuit comprising means for receiving said clock signal having a voltage swing greater than two volts; means for transforming said received clock signal having a voltage swing greater than two volts to a corresponding clock signal having a voltage swing of less than two volts; and means for outputting said corresponding clock signal having a voltage swing of less than two volts; and
   a CMOS receiver circuit comprising means for receiving said corresponding clock signal having a voltage swing of less than two volts; means for converting said received corresponding clock signal having a voltage swing of less than two volts to a second corresponding clock signal having a voltage swing greater than two volts; and means for outputting said second corresponding clock signal having a voltage swing greater than two volts.

25. A system for distributing a clock signal, said system comprising:

a CMOS driver circuit comprising means for receiving a signal having a voltage swing greater than two volts; means for transforming said received signal having a voltage swing greater than two volts to a corresponding signal having a voltage swing of less than two volts; and means for outputting said corresponding signal having a voltage swing of less than two volts; and a CMOS receiver circuit comprising means for receiving said corresponding signal having a voltage swing of less than two volts; means for converting said received corresponding signal having a voltage swing of less than two volts to a second corresponding signal having a voltage swing greater than two volts; and means for outputting said second corresponding signal having a voltage swing greater than two volts, wherein said means for receiving said corresponding signal having a voltage swing of less than two volts includes a resistive component across said means for receiving said corresponding signal.

* * * * *